(12) United States Patent
Guitard et al.

(10) Patent No.: US 9,419,393 B2
(45) Date of Patent: Aug. 16, 2016

(54) MALE RJ45 CONNECTOR FOR RJ45 ELECTRICAL CONNECTION CORD

(71) Applicants: LEGRAND FRANCE, Limoges (FR); LEGRAND SNC, Limoges (FR)

(72) Inventors: Julien Guitard, Saint Antoine l'Abbaye (FR); Vincent Grigis, Notre Dame de l'Osier (FR)

(73) Assignees: LEGRAND FRANCE, Limoges (FR); LEGRAND SNC, Limoges (FR)

( * ) Notice: Subject to any disclaimer, the term of this patent is extended or adjusted under 35 U.S.C. 154(b) by 63 days.

(21) Appl. No.: 14/573,169

(22) Filed: Dec. 17, 2014

(65) Prior Publication Data

US 2015/0207283 A1 Jul. 23, 2015

(30) Foreign Application Priority Data

Jan. 17, 2014 (FR) .................................... 14 50403

(51) Int. Cl.
*H01R 25/00* (2006.01)
*H01R 13/6587* (2011.01)
(Continued)

(52) U.S. Cl.
CPC .......... *H01R 25/003* (2013.01); *H01R 13/6272* (2013.01); *H01R 13/6587* (2013.01); *H01R 13/6594* (2013.01); *H01R 24/78* (2013.01); *H05K 1/117* (2013.01); *H01R 4/2433* (2013.01); *H01R 12/585* (2013.01); *H01R 12/727* (2013.01); *H01R 13/6463* (2013.01); *H01R 13/6581* (2013.01); *H01R 13/6583* (2013.01); *H01R 13/65807* (2013.01); *H01R 23/688* (2013.01); *H01R 23/6873* (2013.01); *H01R 24/28* (2013.01); *H01R 24/64* (2013.01); *H01R 31/06* (2013.01); *H01R 2201/04* (2013.01);

(Continued)

(58) Field of Classification Search
CPC .. H01R 24/64; H01R 23/6873; H01R 12/585; H01R 12/727; H01R 13/6583; H01R 13/6594; H01R 2201/04; H01R 23/688; H01R 13/65807; H01R 13/6581
USPC ........ 439/638, 731, 607.46, 607.38, 906, 465
See application file for complete search history.

(56) References Cited

U.S. PATENT DOCUMENTS

| 8,298,922 B2 * | 10/2012 | Schumann | ......... H01R 13/5829 438/467 |
|---|---|---|---|
| 2009/0142968 A1 * | 6/2009 | Goodrich | ............. H01R 4/2412 439/676 |
| 2011/0201234 A1 | 8/2011 | Long | |

OTHER PUBLICATIONS

FR Search Report, dated Jul. 3, 2014, from corresponding FR application.

*Primary Examiner* — Abdullah Riyami
*Assistant Examiner* — Justin Kratt
(74) *Attorney, Agent, or Firm* — Young & Thompson

(57) ABSTRACT

A male RJ45 connector includes a printed circuit (8) having electrical tracks, at least one grounding plate sandwiched between faces (23, 24) of the circuit and a slot extending longitudinally and opening on a side (38) of the circuit and being configured to pass through both the faces and the at least one grounding plate; and a spreader system (9) mounted on the circuit and including a separator body (25), an extension body (26) provided with a hollow (27) configured to receive the printed circuit and a central wall (28) dividing the hollow (27) into two parts and being configured to be inserted into the slot; the central wall and the at least one grounding plate being configured to be electrically interconnected and form an electrically and/or magnetically shielding barrier between pairs of conducting wires (11-14) mounted on the spreader and connected to the circuit.

20 Claims, 7 Drawing Sheets

(51) Int. Cl.
  H01R 13/6594   (2011.01)
  H05K 1/11   (2006.01)
  H01R 13/627   (2006.01)
  H01R 24/78   (2011.01)
  H01R 13/658   (2011.01)
  H01R 13/6583   (2011.01)
  H01R 13/58   (2011.01)
  H01R 13/6581   (2011.01)
  H01R 12/72   (2011.01)
  H01R 12/50   (2011.01)
  H01R 4/24   (2006.01)
  H01R 13/6463   (2011.01)
  H01R 24/28   (2011.01)
  H01R 24/64   (2011.01)
  H01R 31/06   (2006.01)
  H05K 1/02   (2006.01)

(52) U.S. Cl.
  CPC ...... *H05K 1/0245* (2013.01); *H05K 2201/0723* (2013.01); *H05K 2201/09063* (2013.01); *H05K 2201/09172* (2013.01); *H05K 2201/10295* (2013.01); *H05K 2201/10356* (2013.01)

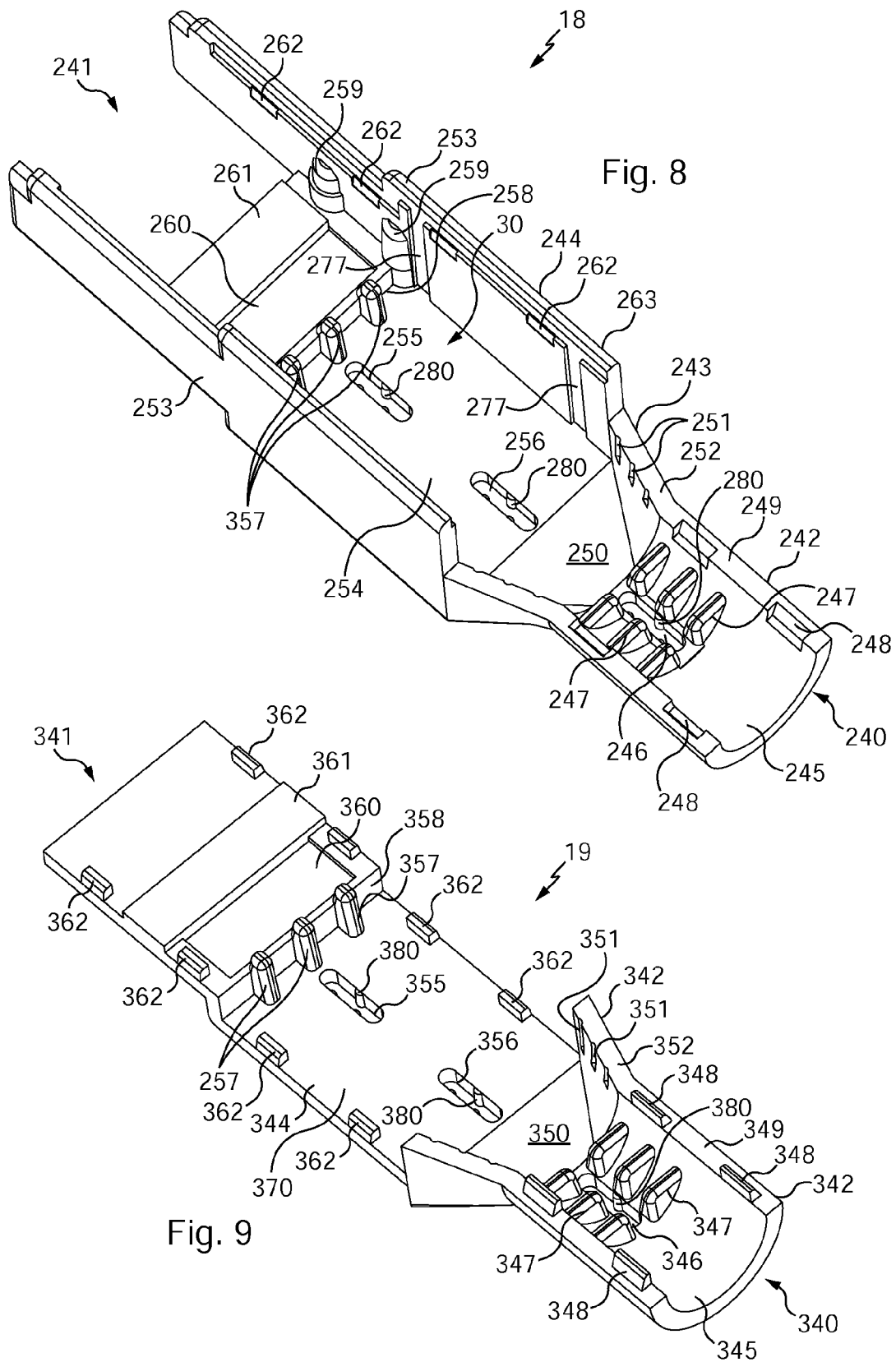

MALE RJ45 CONNECTOR FOR RJ45 ELECTRICAL CONNECTION CORD

FIELD OF THE INVENTION

The invention concerns the field of connection technology and more particularly male RJ45 connectors for RJ45 connection cords configured to interconnect items of electronic and/or computer equipment.

TECHNOLOGICAL BACKGROUND

From U.S. Pat. No. 8,298,922 such a male RJ45 connector is known for an RJ45 connection cord, which is provided with a printed circuit board having two opposite faces and electrical conveyance tracks on each of those faces, a separation system configured to separate pairs of conducting wires comprised by the RJ45 connection cord, and a metallic outer shell partially enveloping the printed circuit.

The system for separating the pairs of conducting wires comprises two similar sub-assemblies produced from non-conducting material and which are mounted on respective opposite sides on the faces of the printed circuit.

The RJ45 connector comprises four self-stripping contact devices mounted proud on each of the faces of the printed circuit, as well as a shielding wall also mounted proud on each of the faces of the printed circuit.

Each separation sub-assembly comprises a body in which are provided four insertion cavities configured to receive two pairs of conducting wires, four grooves configured for each to receive an end of a respective self-stripping contact device, as well as an insertion slot configured to accommodate a respective shielding wall.

SUBJECT OF THE INVENTION

The invention is directed to providing a male RJ45 connector of a similar kind, which is particularly simple, convenient and economic with respect to both manufacture and use.

According to a first aspect, the invention also relates to a male RJ45 connector for an RJ45 electrical connection cord provided with a cable having four pairs of conducting wires that are configured to be electrically connected to said male connector, which connector comprises a printed circuit having a first face and a second face which is an opposite face to said first face, as well as a plurality of electrical conveyance tracks to which said pairs of conducting wires are configured to be connected electrically, a spreader system mounted on said printed circuit and configured to separate, electrically insulate and electrically shield said pairs of conducting wires from each other; said male connector being characterized in that:
said printed circuit comprises at least one grounding plate sandwiched between its first and second faces and a central through-slot extending longitudinally in said printed circuit and opening on a side of said printed circuit, said central through-slot being configured to pass through both said first and second faces and said at least one electrical grounding plate;
said spreader system comprises a separator body and an extension body projecting from said separator body, said extension body being provided with a hollow configured to receive said printed circuit and an electrically and/or magnetically shielding central wall dividing said hollow into two parts and being configured to be inserted at least mostly into said central through-slot of said printed circuit;
and said electrically and/or magnetically shielding central wall and said at least one grounding plate of said printed circuit are configured to be electrically interconnected and thus form an electrically and/or magnetically shielding barrier between each pair of conducting wires.

The electrically and/or magnetically shielding barrier which is created between each location for the pairs of conducting wires, which wires are themselves configured to be electrically connected to that male connector, advantageously makes it possible to provide the male connector according to the invention with particularly good performance with regard to crosstalk.

To be precise, the level of crosstalk generated between the pairs of conducting wires in the male RJ45 connector according to the invention is here rendered negligible, or almost so, by virtue of the partitioning both of the wire pairs which are juxtaposed in the spreader system, thanks to the electrically and/or magnetically shielding central wall which is inserted into the slot of the printed circuit, and of the wire pairs which are superposed in the spreader system, thanks to said at least one grounding plate of the printed circuit, which is inserted in the hollow of the extension body of the spreader system.

According to preferred features which are simple, convenient and economical, the male connector further comprises a metallic envelope configured to envelope said printed circuit at least partially, and said electrically and/or magnetically shielding central wall, said at least one grounding plate and said metallic envelope are configured to be electrically interconnected and thus substantially form an individual electrically and/or magnetically shielding cage around each pair of conducting wires.

This makes it possible to create an electrically and/or magnetically shielding barrier with still better performance and thus render still more negligible the level of crosstalk generated between the conducting wire pairs in the male RJ45 connector according to the invention.

According to preferred, simple, convenient and economical features of the male RJ45 connector according to the invention:
said electrically and/or magnetically shielding central wall is provided with an upper end and a lower end which is an opposite end to said upper end, and with at least one projection formed on at least one said upper and/or lower end and configured to be at least partially received in at least one cavity formed in said metallic envelope;
said male connector further comprises contact blades configured to be fastened to said printed circuit and a contact body configured to be mounted on said contact plates, and said metallic envelope is provided with a recessed portion and/or a proud portion against which is positioned said contact body;
said male connector further comprises a snap-engaging part configured to immobilize said male connector in a female connector in which said male connector is configured to be mounted, and said metallic envelope is provided with a recessed portion and/or a proud portion against which is positioned said snap-engaging part;
said metallic envelope is formed in two parts, respectively a connector body configured to receive said printed circuit and said spreader system, as well as a connector cover configured to be mounted on said connector body and to cover said printed circuit and said spreader system;
said printed circuit is provided with at least one notch formed on at least one side of said printed circuit and said metallic envelope is provided with at least one contact lug configured to cooperate with said at least one notch so as to establish an electrical connection between said at least one grounding plate and said metallic envelope;

said spreader system further comprises self-stripping contact systems configured to establish an electrical connection between said pairs of conducting wires and said electrical conveyance tracks of said printed circuit, each self-stripping contact system being provided with two self-stripping contact members and with a molded body that is configured to receive at least partially and to electrically insulate from each other said self-stripping contact members, said extension body of said spreader system comprises two positioning parts mounted on said central wall on respective opposite sides of said hollow, and each molded body is fastened both to a respective said positioning part and to said separator body;

at least one said positioning part has an outside face on which is formed at least one bearing surface and said metallic envelope is provided with at least one contact and positioning member which is configured to come to bear on said at least one bearing surface; and/or at least one said positioning part has lateral bosses and said metallic envelope has at least one inside face provided with grooves which are configured to cooperate with said lateral bosses, so as to establish an electrical connection between the spreader and the metallic envelope;

each molded body is provided with a base face turned towards said hollow, with three longitudinal small walls situated apart from each other and extending remotely from said base face, two insertion spaces each provided between two successive small walls and each extending transversely in said molded body until they open onto said base face, and each self-stripping contact member is inserted into a respective said insertion space and projects on respective opposite sides of said space;

each molded body is provided with a base face and with at least one rib formed on said base face and projecting into said hollow formed in said extension body, said at least one rib being configured to guide said printed circuit into said hollow.

said separator body is provided with first attachment lugs extending towards a respective said positioning part, which is provided with at least one second attachment lug extending facing a respective said first attachment lug, and each molded body is provided with two pincer-shaped ends respectively mounted on a said first attachment lug and on a second said attachment lug facing the latter;

said separator body comprises a cross-shaped metallic base having a central wall and two lateral walls disposed on respective opposite sides of the central wall, said central wall having an upper end and a lower end which is an opposite end to said upper end, and at least one projection formed projecting from at least one said upper and/or lower end and configured to be at least partially received in at least one cavity formed in said metallic envelope; and/or said separator body comprises a cross-shaped metallic base having a central wall and two lateral walls disposed on respective opposite sides of the central wall and each having a portion provided with lateral bosses and said metallic envelope has at least one inside face provided with grooves which are configured to cooperate with said lateral bosses, so as to establish an electrical connection between the spreader and the metallic envelope.

According to a second aspect, the invention also relates to an RJ45 connection cord configured to interconnect items of electronic and/or computer equipment, comprising an electric cable having a first end and a second end which is an opposite end to the first end, an insulating sheath and four pairs of conducting wires enveloped in said sheath; and at least one male RJ45 connector as described above, mounted on at least one said first end and/or second end of said cable.

The connection cord according to the invention is thus particularly simple, convenient and economical in terms of both manufacture and use.

BRIEF DESCRIPTION OF THE DRAWINGS

The disclosure of the invention will now be continued with the description of an example embodiment, given below by way of illustrative and non-limiting example, with reference to the accompanying drawings, in which:

FIGS. 8 and 9 are diagrammatic representations in perspective respectively of a connector body and a connector cover, forming a metallic envelope comprised by the first male connector illustrated in FIG. 2;

DETAILED DESCRIPTION OF AN EMBODIMENT

Figure 1:
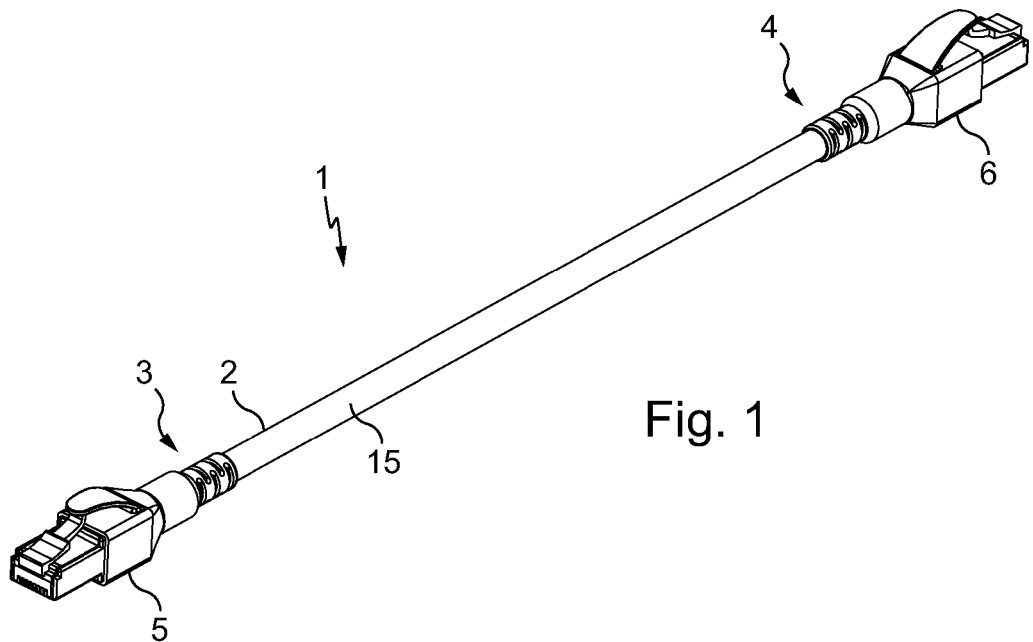
FIG. 1 is a diagrammatic representation in perspective of an RJ45 connection cord in accordance with the invention, provided with a cable and with two male connectors fastened to two opposite ends of the cable.

FIG. 1 illustrates an RJ45 connection cord (RJ standing for "Registered Jack"), referenced 1, configured to interconnect items of electronic and/or computer equipment.

This cord 1 comprises an electric cable 2 having a first end 3 and a second end 4 which is an opposite end to the first end 3.

This cord 1 further comprises a first male connector 5 mounted on the first end 3 of the cable 2 and a second male connector 6 mounted on the second end 4 of the cable 2.

The male connectors 5 and 6 are formed here by male jacks and are configured to be inserted into respective female connectors (not illustrated), formed by female sockets.

Figure 2:
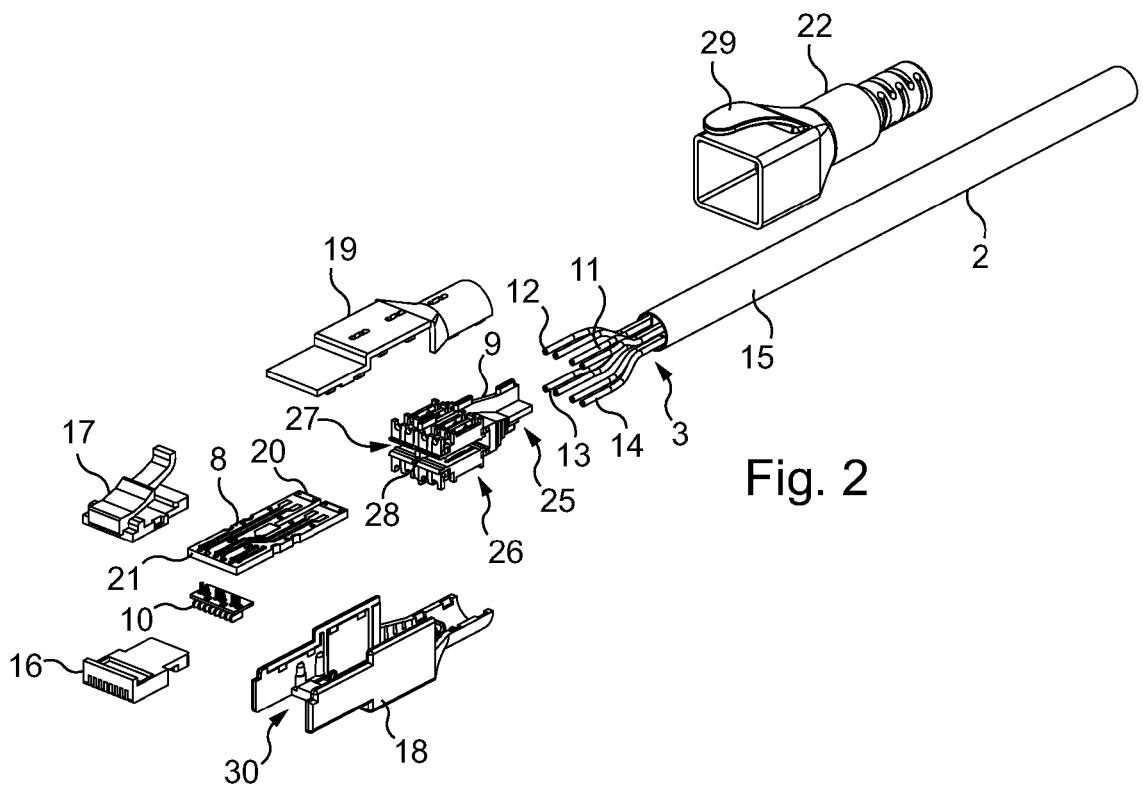
FIG. 2 is an exploded diagrammatic representation in perspective of a first male connector at a first end of the cable of the cord illustrated in FIG. 1.

The cable 2 comprises an insulating sheath 15 and four pairs of twisted conducting wires 11 to 14 enveloped in the sheath 15, respectively a first pair of wires 11, a second pair of wires 12, a third pair of wires 13 and a fourth pair of wires 14 (FIG. 2).

In the example illustrated and described, the first pair of wires 11 corresponds to the blue pair of conducting wires of the telecommunications cabling standard ANSI/TIA/EIA 568-B, the second pair of wires 12 corresponds to the orange pair of conducting wires of that standard, the third pair of wires 13 corresponds to the green pair of conducting wires of that standard and the fourth pair of wires 14 corresponds to the brown pair of conducting wires of that standard.

The cable 2 here has electrical and/or magnetic shielding, formed for example by one or more members of metallic mesh (not shown) surrounding the pairs of conducting wires 11 to 14 at least partially.

This electrical and/or magnetic shielding extends for example along the cable 2 between the first and second male connectors 5 and 6 or is at least situated at the location of the first and second ends 3 and 4 of the cable 2.

The first and second male connectors 5 and 6 comprise the same parts arranged in a similar manner in relation to each other and on the respective ends 3 and 4 of the cable 2. An overall description is given of only the first male connector 5 mounted on the first end 3 of the cable 2, illustrated in FIG. 2.

The first male connector 5 comprises a printed circuit 8 provided with a first face 23 and with a second face 24 which is an opposite face to the first face 23 (FIGS. 3 and 4), and with a plurality of electrical conveyance tracks 41 to 44 provided on those first and second faces 23 and 24.

The first male connector 5 comprises a spreader system 9, hereinafter called spreader, configured to be mounted on a first side 20 of the printed circuit 8, on both its first and second faces 23 and 24, to electrically connect the pairs of wires 11 to 14 to the tracks 41 to 44 of the printed circuit 8.

The spreader 9 here has a separator body 25 and an extension body 26 projecting from the separator body 25. The extension body 26 has a hollow 27 for receiving the printed circuit 8 and is provided with an electrically and/or magnetically shielding central wall 28 dividing that hollow 27 into two parts.

The separator body 25 is configured here to separate from each other and direct the pairs of conducting wires 11 to 14 apart whereas the extension body 26 is configured here to establish the electrical connections between those conducting wires 11 to 14 and the tracks 41 to 44 of the printed circuit 8. The extension body 26 here has self-stripping contact systems 229 (FIGS. 6 and 7) to establish those electrical connections.

The first male connector 5 comprises contact blades 10 configured to be mounted on a second side 21 of the printed circuit 8, which is an opposite side to its first side 20, to electrically connect the tracks 41 to 44 of the printed circuit 8 to contact members of a corresponding female connector (which are not illustrated).

The contact blades 10 are configured here to be mounted on one or other of the first and second faces 23 and 24 of the printed circuit 8 (see below for more detail).

The first male connector 5 further comprises a contact body 16 configured to be mounted on the contact blades 10 and to be at least partially inserted into the female connector.

The first male connector 5 comprises a snap-engaging part 17 configured to be mounted on the second side 21 of the printed circuit 8, away from the contact body 16, and be at least partially inserted and locked by snap-engagement in the female connector so as to immobilize the first male connector 5 therein.

The contact body 16 is thus mounted on the same face of the printed circuit 8 as the contact blades 10, whereas the snap-engaging part 17 is here mounted on the other face of the printed circuit 8.

The first male connector 5 further comprises an envelope, here metallic and formed from a connector body 18 and a connector cover 19 which are configured to be assembled with each other and so envelope at least a major part of the printed circuit 8, the spreader 9 and the contact blades 10.

As will be seen below in more detail, the first male connector 5 is configured such that the connector body 18, the connector cover 19, the printed circuit 8 and the spreader 9 are connected together electrically.

The connector body 18 here forms a lower half-shell defining an inside space 30 configured to receive the printed circuit 8 and having a base wall (not shown) configured to face the face of the printed circuit 8 on which the contact blades 10 are mounted.

The connector cover 19 here forms an upper half-shell configured to be mounted in particular on the printed circuit 8 and on the spreader 9 and has an upper wall (not shown) configured to face the face of the printed circuit 8 which is an opposite face to that on which the contact blades 10 are mounted.

The first male connector 5 further comprises a sleeve 22, here substantially tubular; formed from plastics material, and configured to cover the end 3 of the cable 2 as well as partially cover the connector body 18 and the connector cover 19.

This sleeve 22 comprises a deformable tab 29 configured to come to bear on the end of a deformable lug of the snap-engaging part 17, to unlock the first male connector 5 from the female connector.

The printed circuit 8 will now be described in more detail with reference to FIGS. 3 to 5.

The printed circuit 8 is here formed of a multi-layer structure, comprising three layers referred to as substrate layers 32 and four layers referred to as copper layers 31 (of which only two are represented), interposed between the first and second faces 23 and 24 on which are formed the tracks 41 to 44.

The two copper layers sandwiched between the three substrate layers 32 form electrical grounding plates 31, also called grounding planes or ground planes.

The printed circuit 8 has a first pair of tracks 41*a-b*, a second pair of tracks 42*a-b*, a third pair of tracks 43*a-b* and a fourth pair of tracks 44*a-b* which pass along the first and second faces 23 and 24.

The printed circuit 8 has, on its first side 20, a first pair of input connection terminals 51*a-b* of the circuit 8 and a second pair of input connection terminals 52*a-b* of the circuit 8, which are provided on the first face 23 of the circuit 8, as well as a third pair of input connection terminals 53*a-b* of the circuit 8 and a fourth pair of input connection terminals 54*a-b* of the circuit 8, which are provided on the second face 24 of the circuit 8.

The printed circuit 8 also has, on its first side 20, a first copper plane 71 disposed facing the first pair of connection terminals 51*a-b*, a second copper plane 72 disposed facing the second pair of connection terminals 52*a-b*; a third copper plane 73 disposed facing the third pair of connection terminals 53*a-b*; and a fourth copper plane 74 disposed facing the fourth pair of connection terminals 54*a-b*;

Each of the copper planes 71 to 74 is equipped here with two vias each configured to establish an equipotential electrical connection between the grounding planes 31.

The printed circuit 8 has, on its second side 21, a first pair of output connection terminals 61*a-b* of the circuit 8, a second pair of output connection terminals 62*a-b* of the circuit 8, a third pair of output connection terminals 63*a-b* of the circuit 8 and a fourth pair of output connection terminals 64*a-b* of the circuit 8.

Each output connection terminal is formed through the circuit 8 and emerges on both the first and second faces 23 and 24 of the circuit 8.

The input connection terminals 51-54 are aligned pairwise here on the respective faces 23-24 of the circuit 8 whereas the output connection terminals 61-64 are disposed in two rows, one of the rows having six output connection terminals 61*a-b*, 62*a-b* and 64*a-b* and the other row having the two remaining output connection terminals 63*a-b*.

The first pair of input connection terminals 51*a-b* is here connected directly to the first pair of output connection terminals 61*a-b* via the first pair of tracks 41*a-b*, which tracks each comprise a single portion which passes in continuous manner only over the first face 23 of the circuit 8.

The second pair of input connection terminals 52*a-b* is here connected directly to the second pair of output connection terminals 62*a-b* via the second pair of tracks 42*a-b*, which tracks each comprise a single portion which passes in continuous manner only over the first face 23 of the circuit 8.

The third pair of input connection terminals 53*a-b* is here connected directly to the third pair of output connection terminals 63*a-b* via the third pair of tracks 43*a-b*, which tracks each comprise a single portion which passes in continuous manner only over the second face 24 of the circuit 8.

The fourth pair of input connection terminals 54*a-b* is here indirectly connected to the fourth pair of output connection terminals 64*a-b* via the fourth pair of tracks 44*a-b*, which tracks each comprise a first portion, respectively 45*a* and 45*b*, which passes over the second face 24 of the circuit 8 as well as a second portion, respectively 46*a* and 46*b*, which passes over the first face 23 of the circuit 8.

The first and second respective portions of the tracks 44*a* and 44*b* are connected by transition portions 47 which cross the electrical grounding plates 31 of the circuit 8 to attain one or other of the faces 23 and 24 of the circuit 8. These transition portions are formed here by transition vias 47 which are metalized holes and thus electrical conductors.

The printed circuit 8 further comprises a plurality of interconnection vias 35 accommodated at different places in the circuit 8 and which all together cross the first and second faces 23 and 24 and the grounding plates 31 of the circuit 8. These interconnection vias 35 are here formed by metalized holes and are thus electrical conductors passing by the grounding plates 31.

The vias 35 are configured to maintain an equipotential connection between the grounding plates 31 of the printed circuit 8, which makes it possible to avoid creating different surface currents between each grounding plate 31.

It should be noted that certain vias 35 are furthermore configured to improve the electrical and/or magnetic shielding between the pairs of conveyance tracks. These are for example the two pairs of vias 35 disposed on the second side 21 of the printed circuit 8 and which are respectively interposed between the first pair of tracks 41*a-b* and the second portions 46*a* and 46*b* of the fourth pair of tracks 44*a-b* and between the first pair of tracks 41*a-b* and the second pair of tracks 42*a-b*.

The printed circuit 8 has a third side 33 and a fourth side 34 which is an opposite side to the third side 33, as well as two notches 36 formed on each of the third and fourth sides 33 and 34, in the material of the circuit 8. These notches 36 are configured to enable the establishment of an electrical connection between the grounding plates 31 and the connector body 18.

The printed circuit 8 further comprises a central throughslot 38 extending longitudinally in the circuit 8 and opening on the first side 20 of the circuit 8. The slot 38 passes both through the first and second faces 23 and 24 and the grounding plates 31 of the circuit 8 and is configured to receive the central wall 28 of the spreader 9.

The printed circuit 8 further comprises a connection pad 37 accommodated at the end of the slot 38 and emerging at each of the first and second faces 23 and 24. The connection pad 37 is equipped with vias (not shown) which are configured to minimize the electrical and/or magnetic coupling between the pairs of conveyance tracks 41 to 44.

Figure 6:
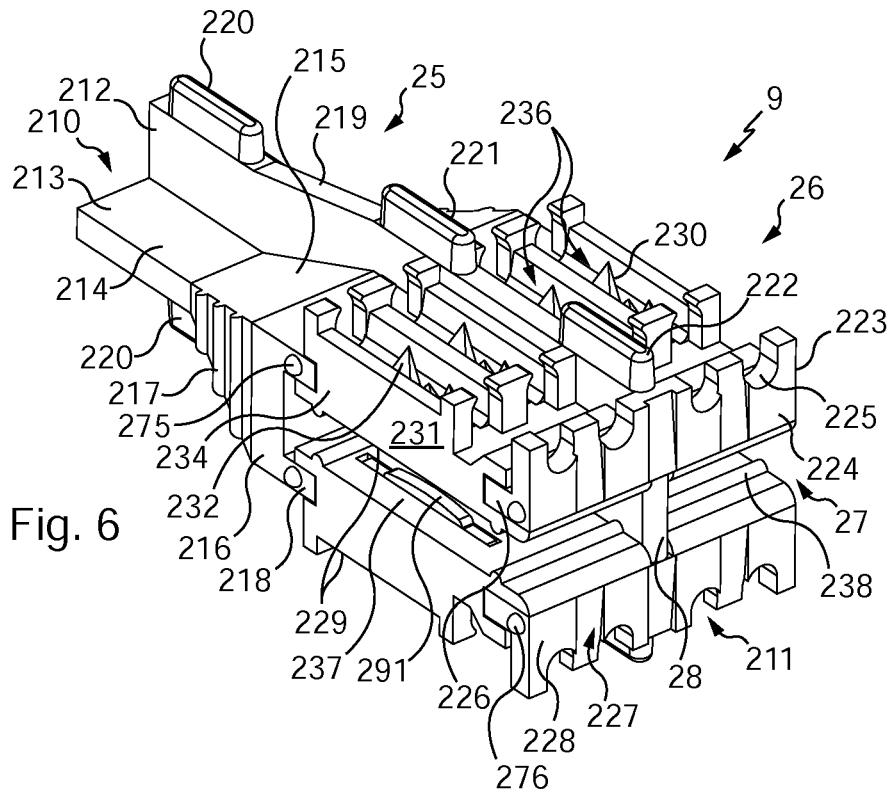
FIGS. 6 and 7 are diagrammatic representations in perspective of a spreader of the first male connector illustrated in FIG. 2, from different viewing angles.
Figure 7:
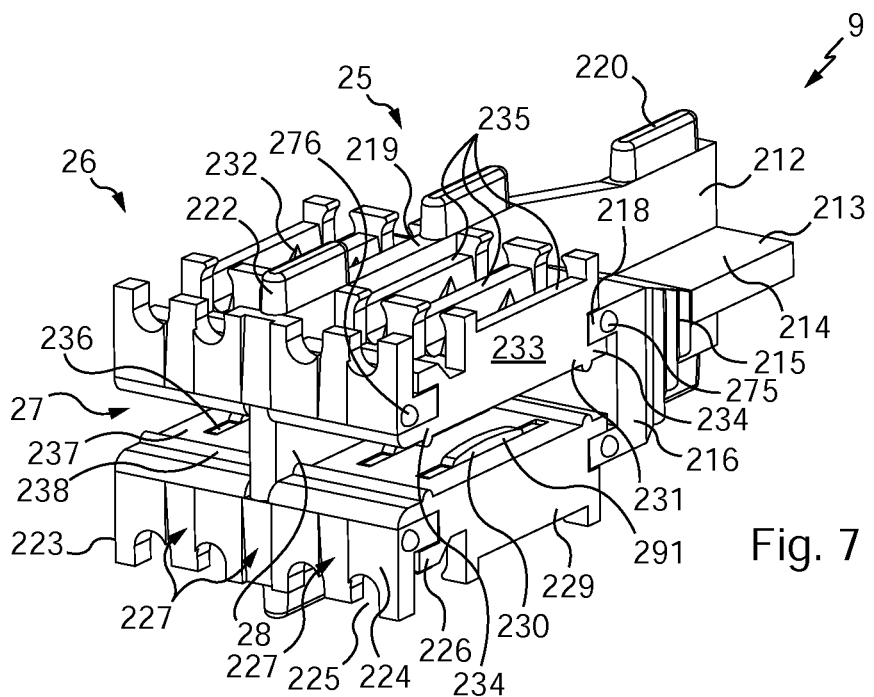

FIGS. 6 and 7 show the spreader 9 in detail from different viewing angles.

The spreader 9 has a longitudinal overall shape extending between a first end 210, from which extends the separator body 25, and a second end 211 which is an opposite end to the first end 210, up to which extends the extension body 26 projecting from the separator body 25.

It will be noted that the spreader 9 here has two orthogonal axes of symmetry, extending longitudinally along the spreader 9 such that the latter has an upper part and a lower part which is a mirror image of the upper part as well as a first lateral part and a second lateral part which is also a mirror image of the first lateral part.

The separator body 25 here comprises a cross-shaped metallic base having a central wall 212 and two lateral walls 213 disposed on respective opposite sides of the central wall 212. In FIGS. 6 and 7, the central wall 212 is vertical whereas the lateral walls 213 are horizontal.

Each lateral wall 213 has a first portion 214 which is planar, a second portion 215 extending from the first portion 214 and which is substantially conical, as well as a third portion 216 extending from the second portion 215, at the location of its most flared end, and which is planar.

The second conical portion 215 is provided with lateral bosses 217 and the third portion 216 is substantially C-shaped and provided with two first attachment lugs 218 on which are also formed lateral bosses 275.

The central wall 28 of the extension body 26 is metallic here and extends in line with the central wall 212 of the separator body 25.

The spreader 9 has an upper edge 219 passing along respective upper ends of the central walls 212 and 28 and three projections 220, 221 and 222, referred to as upper projections, which extend projecting from that upper edge 219.

The spreader 9 furthermore has a lower edge (not shown) passing along respective lower ends of the central walls 212 and 28 and three projections identical to those mentioned above, referred to as lower projections, and of which only one is visible on the drawings, which extend projecting from the lower edge.

The projection 220 is formed on the central wall 212, the projection 222 is formed on the central wall 28 and the projection 221 is formed astride the central walls 212 and 28.

The extension body 26 comprises two positioning parts 223 here substantially L-shaped, each mounted on the central wall 28 at the second end 211 of the spreader 9 and on respective opposite sides of the hollow 27 formed in the extension body 26.

Each positioning part 223 is metallic here and has a first limb 224 of the L in which are formed two notches 225, as well as a second limb 226 of the L extending from the first limb 224 towards the separator body 25.

It should be noted that the notches 25 are provided for the initial positioning of the pairs of wires when these latter are mounted on the spreader 9 (see below for more detail). Once the wires are in place, they are cut at the location of their respective free end (see FIGS. 10 and 11).

The second limb of the L here forms a second attachment lug 226 disposed on respective opposite sides of the central wall 28 of the extension body.

The first limb 224 here furthermore has an outside face 228 on the opposite side to the side from which extends the second limb, on which outside face 228 are formed three bearing surfaces 227.

Each bearing surface 227 is here formed between two successive notches 225.

It will be noted that the separator body 25 and the extension body 26 are configured such that each first attachment lug 218 is situated opposite and away from a respective second attachment lug 226.

Each positioning part 223 is furthermore provided with lateral bosses 276, similar to the lateral bosses 275 formed on the third portion 216 of each lateral wall 213, and which are situated at the junction between the first and second limbs of the L.

The extension body 26 further comprises self-stripping contact systems 229 each disposed in the space formed between the first and second respective attachment lugs 218 and 226.

Each self-stripping contact system 229 comprises two self-stripping contact members 230 which are metallic, and a molded body 231 which is formed of plastic material and in which those two members 230 are accommodated.

Each member 230 comprises a contact base 291 and perforation teeth 232 which project from the contact base 291.

Each molded body 231 comprises a longitudinal portion 233 which has, at both its ends, two recesses 234 thus forming two substantially C-shaped clips which are respectively mounted on a first attachment lug 218 of the third portion 216 and on a second attachment lug 226 of a positioning part 223.

Each longitudinal portion 233 has a base face 237 and three longitudinal small walls 235 situated apart from each other and extending remotely from the base face 237.

Each molded body 231 further comprises two insertion spaces 236 each formed between two successive small walls 235 and each extending transversely in the longitudinal portion 233 until they open in the base face 237.

A self-stripping contact member 230 is inserted into each of the insertion spaces 236.

Each insertion space 236 has a cavity-forming part to accommodate the contact base 291 of a respective member 230, as well as a tunnel-forming part, between two respective small walls 235, in which project the respective perforation teeth 232.

The contact base 291 of each member 230 projects from the cavity-forming part of the respective insertion space 236, in the hollow 27 formed in the extension body 26.

Each molded body 231 further comprises, at each end of the longitudinal portion 233, a rib 238 formed on the base face 237 and projecting into the hollow 27 formed in the extension body 26.

In the spreader 9, eight members 230 are thus disposed, in pairs, on respective opposite sides of the central wall 28 and on respective opposite sides of the hollow 27 of the extension body 26, in line with the upper and lower faces of the two lateral portions 213 of the separator body 25.

FIGS. 8 and 9 show in detail the connector body 18 and the connector cover 19 forming a metallic envelope comprised by the first male connector 5.

The connector body 18 is generally U-shaped and has a first end 240 and a second end 241 which is an opposite end to the first end 240.

The connector body 18 comprises a first portion 242 extending from the first end 240 and which is substantially cylindrical, a second portion 243 extending from the first portion 242 and which is substantially frusto-conical, and a third portion 244 extending from the most flared part of the second portion 243 to the second end 241, and which is U-shaped.

The first cylindrical portion 242 has an inside face 245 on which is recessed a cavity 246 which is configured to receive the projection 220 referred to as upper projection of the spreader 9; so as to establish an electrical connection between the connector body 18 and the spreader 9. In this cavity 246 small ribs 280 are formed.

The first cylindrical portion 242 comprises holding members 247 formed projecting from the inside face 245 and which are configured to hold the conducting wires in position on the separator body 25 of the spreader 9.

The first cylindrical portion 242 furthermore has an edge 249 and assembly notches 248 recessed into that edge 249.

The second frusto-conical portion 243 has an inside face 250 on which are recessed grooves 251 in the vicinity of an edge 252 and which are configured to cooperate with the bosses 217 of the separator body 25 of the spreader 9; so as to establish an electrical connection between the connector body 18 and the spreader 9.

The third U-shaped portion 244 is provided with two lateral walls 253 facing each other and with a base wall 254 connecting the two lateral walls 253, those walls providing overall definition of the inside space 30 of the connector body 18.

The third portion 244 has two grooves 277 formed in each lateral wall 253 and configured to receive lateral bosses 275 and 276 respectively formed on the separator body 25 and on the extension body 26; so as to establish an electrical connection between the connector body 18 and the spreader 9.

The third portion 244 comprises two cavities 255 and 256 each recessed into the base wall 254, in the inside space 30, and which are configured respectively to receive the projections 222 and 223 of the spreader 9; so as to establish an electrical connection between the connector body 18 and the spreader 9. In these cavities 255 and 256 small ribs 280 are formed.

The third portion 244 comprises contact and positioning members 257 which extend from the base wall 254 projecting into the inside space 30 and which are configured to come to bear on the respective bearing surfaces 227 of a respective positioning part 223; so as to establish an electrical connection between the connector body 18 and the spreader 9.

The contact and positioning members 257 are formed astride a shoulder 258 comprised by the base wall 254.

The third portion 244 comprises contact lugs 259, each formed both on the base wall 254 and on the lateral walls 253, projecting into the inside space 30.

These contact lugs 259 are configured to cooperate with the notches 36 of the printed circuit 8 so as to establish an electrical connection between the grounding plates 31 of that circuit 8 and the connector body 18.

Two contact lugs 259 are disposed astride the shoulder 258 and two other contact lugs 259 are disposed between that shoulder 258 and the second end 241 of the connector body 18.

The third portion 244 comprises, on its base wall 254, a recessed portion 260 formed between the shoulder 258 and the second end 241 of the connector body 18, as well as a proud portion 261 formed between the recessed portion 260 and that second end 241.

The lateral walls 253 of the third portion 244 each have an edge 263 and assembly notches 262 recessed into the respective edges 263.

The assembly notches 248 and 262 here form assembly members of the connector body 18.

The connector cover 19 is configured to be assembled with the connector body 18 and has a relatively similar shape thereto.

The connector cover 19 has a first end 340 and a second end 341 which is an opposite end to the first end 340.

The connector cover 19 comprises a first portion 342 extending from the first end 340 and which is substantially cylindrical, a second portion 343 extending from the first portion 342 and which is substantially frusto-conical, and a third portion 344 extending from the most flared part of the second portion 343 to the second end 341, and which is substantially planar.

The first cylindrical portion 342 has an inside face 345 on which is recessed a cavity 346 which is configured to receive a projection 220 referred to as lower projection of the spreader 9; so as to establish an electrical connection between the connector cover 19 and the spreader 9. In this cavity 346 small ribs 380 are formed.

The first cylindrical portion 342 comprises holding members 347 formed projecting from the inside face 345 and which are configured to hold the conducting wires in position on the separator body 25 of the spreader 9.

The first cylindrical portion 342 furthermore has an edge 349 and assembly lugs 348 formed projecting from that edge 349, and which are configured to be received in the assembly notches 248 of the connector body 18; so as to establish an electrical connection between the connector cover 19 and the connector body 18.

The second frusto-conical portion 343 has an inside face 350 on which are recessed grooves 351 in the vicinity of an edge 352, which grooves are configured to cooperate with the bosses 217 of the separator body 25 of the spreader 9; so as to establish an electrical connection between the connector cover 19 and the spreader 9.

The third planar portion 344 has an inside face 370 in which are recessed two cavities 355 and 356 which are configured respectively to receive projections referred to as lower projections of the spreader 9; so as to establish an electrical connection between the connector cover 19 and the spreader 9. In these cavities 355 and 356 small ribs 380 are formed.

The third planar portion 344 comprises contact and positioning members 357 which extend projecting from the inside face 370 and which are configured to come to bear on the respective bearing surfaces 227 of a respective positioning part 223; so as to establish an electrical connection between the connector cover 19 and the spreader 9.

The contact and positioning members 357 are formed astride a shoulder 358 comprised by the third planar portion 344.

The third planar portion 344 comprises assembly lugs 362 on its sides which project from the inside face 370, and which are configured to be received in the assembly notches 262 of the connector body 18; so as to establish an electrical connection between the connector body 18 and the connector cover 19.

The assembly lugs 348 and 362 here form assembly members complementary to the connector cover 19.

The third planar portion 344 further comprises a recessed portion 360 formed between the shoulder 358 and the second end 341 of the connector cover 19, as well as a proud portion 361 formed between the recessed portion 360 and that second end 341.

The method of assembling the male connector 5 will now be described with reference to FIGS. 10 to 13. Of course a similar method applies to the male connector 6.

Figure 10:
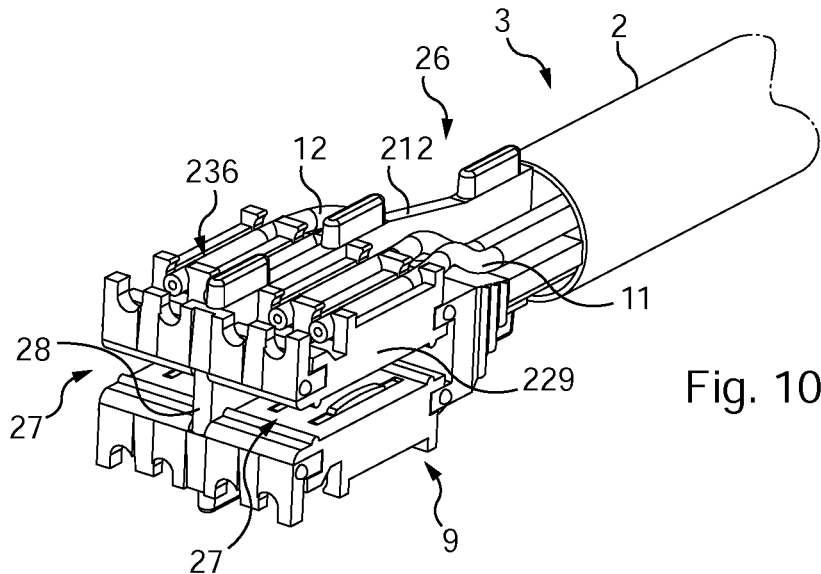
FIGS. 10 to 13 are diagrammatic representations in perspective of different steps of assembly of the first male connector illustrated in FIG. 2.

The pairs of wires 11 to 14 at the end 3 of the cable 2 are fastened to the spreader 9 to form a first connection sub-assembly (FIG. 10). The spreader 9 is placed in direct contact against the sheath 15 of the cable 2.

The pairs of wires 11 to 14 are separated from each other, without crossing, by the separator body 25, and more specifically by the central wall 212 and the lateral walls 213, then brought towards a respective molded body 231 of the extension body 26.

Each wire of the pairs of wires 11 to 14 is inserted into the tunnel part of a respective insertion space 236 of a respective self-stripping contact system 229 as far as the notches 225.

Each conducting wire is thus placed in contact with a respective member 230 by perforation of the insulating sheath enveloping that wire by the respective teeth 232, then each wire is cut to length, between the respective notch 225 and the exit of the respective tunnel part.

Figure 11:
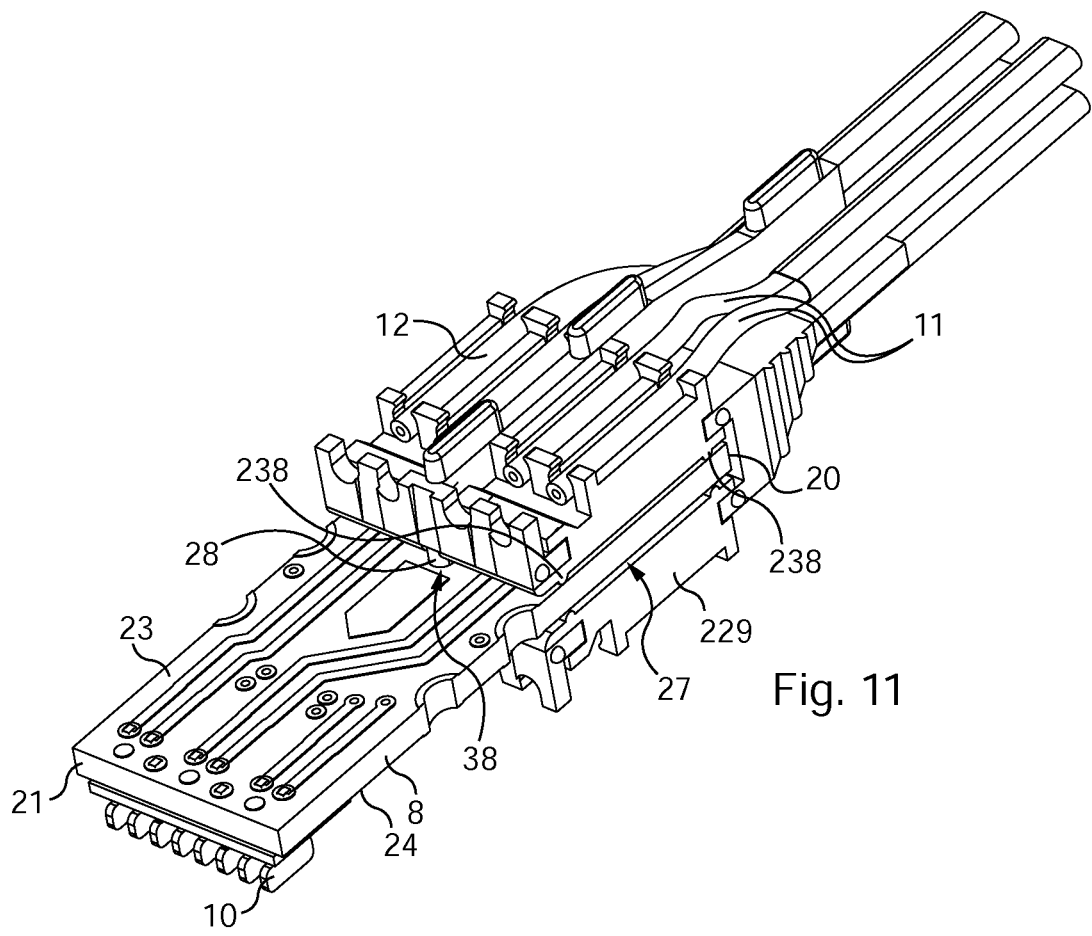
Figure 12:
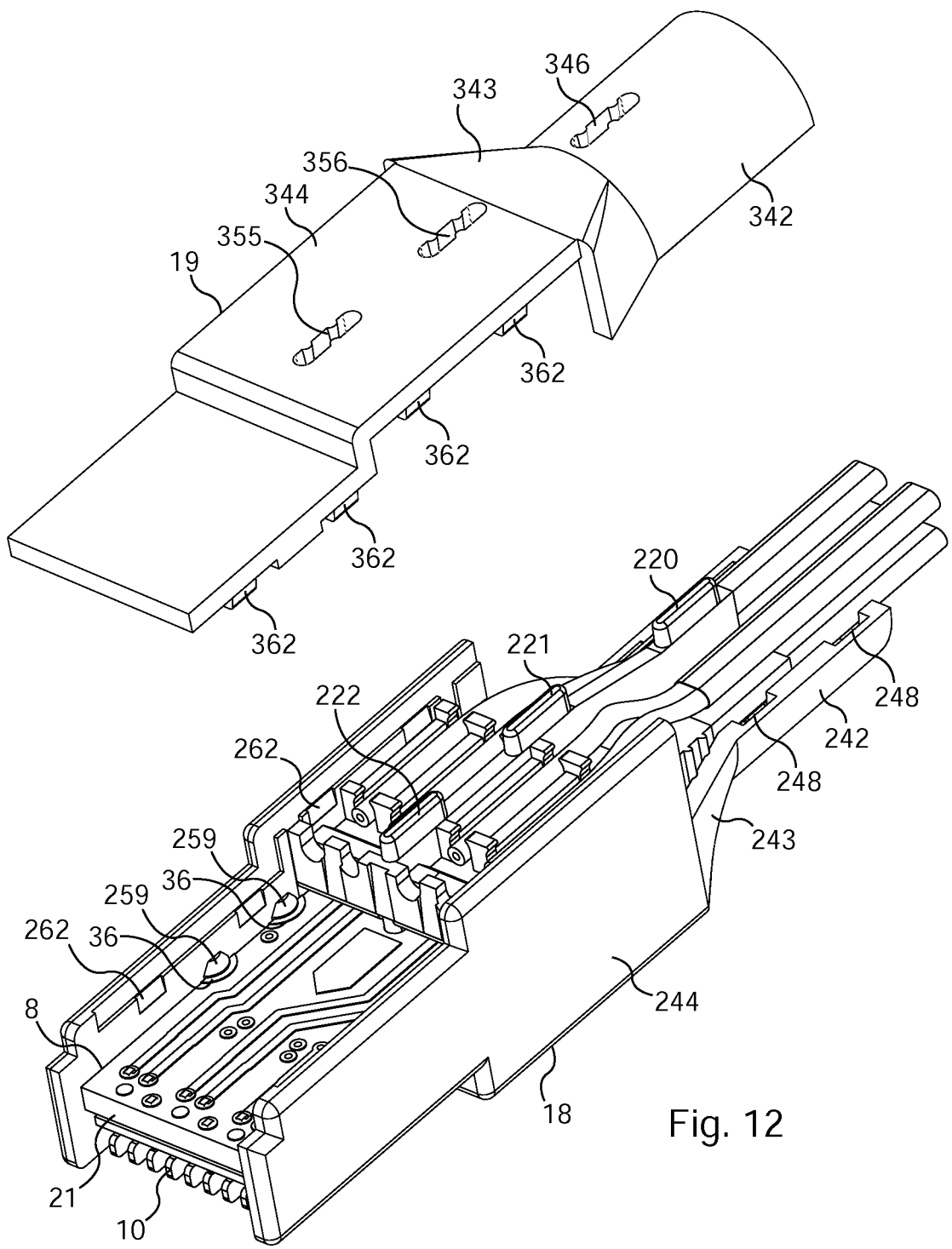

A second sub-assembly formed by the printed circuit 8 and by the contact blades 10 that are fastened thereon is mounted here on the first connection sub-assembly to form a first connection assembly (FIG. 11).

More specifically, this second sub-assembly is partially inserted into the hollow 27 of the spreader 9, by the first side 20 of the circuit 8 where the slot 38 is formed.

The central wall 28 of the extension body 26 is thus inserted into the slot 38 until it abuts with the bottom of the slot 38.

The central wall 28 and the slot 38 are configured such that the sides of the central wall 28 are guided by the wall delimiting the slot 38.

The extension body 26 and the circuit 8 are configured such that the latter has its first and second faces 23 and 24 partially facing the respective inside faces of the respective self-stripping contact systems 229.

The first and second faces 23 and 24 of the circuit 8 furthermore come to bear against the ribs 238 of the respective molded bodies 231 and the circuit 8 is guided by these latter.

The input connection terminals 51 to 54 of the circuit 8 are in mechanical and electrical contact with the portions of the respective contact bases 291 which project into the hollow 27, thereby electrically connecting those input terminals 51 to 54 to the pairs of wires 11 to 14.

The first connection assembly is then partially inserted into the inside space 30 of the connector body 18, from top to bottom, that is to say starting from the edge 263 of the lateral walls 253 in the direction of the base wall 254 of the third portion 244 of that connector body 18.

The lower projections (not shown) of the spreader 9 which project from the lower ends of its central walls 212 and 28 are partially received in the cavities 246, 255 and 256 of the connector body 18; so as to establish an electrical contact between the spreader 9 and the connector body 18.

The first connection assembly is positioned and held in the connector body 18 by the cooperation of the lower projections with the ribs 280 formed in those cavities 246, 255 and 256 and with the holding members 347 of the connector body 18.

The notches 36 formed on each of the third and fourth sides 33 and 34 of the circuit 8 are mounted on the contact lugs 259 of the connector body 18; so as to establish an electrical contact between the circuit 8 and the connector body 18.

The grooves 251 of the second frusto-conical portion 243 cooperate with the lateral bosses 217 of the separator body 25 of the spreader 9; so as to establish an electrical contact between the spreader 9 and the connector body 18.

The grooves 277 of the third portion 244 cooperate with the lateral bosses 275 and 276 of the separator body 25 and of the extension body 26 of the spreader 9; so as to establish an electrical contact between the spreader 9 and the connector body 18.

The contact and positioning members 257 of the third portion 244 come to bear on the respective bearing surfaces 227 of the positioning parts 223; so as to establish an electrical contact between the spreader 9 and the connector body 18.

It will be noted that the contact body 16 is normally mounted on the contacts plates 10 and partially on the circuit 8 before these are inserted into the connector body 18.

The contact body 16 is configured to come to rest on the recessed portion 260 and on the proud portion 261 comprised by the third portion 244 of the connector body 18.

Thus, the first portion 242 of the connector body 18 partially receives a first part of the central wall 212 and the respective first portions 214 of the lateral walls 213 of the separator body 25.

The second portion 243 of the connector body 18 partially receives a second part of the central wall 212 and the respective second portions 215 of those lateral walls 213.

The third portion 244 of the connector body 18 fully receives the spreader 9 and the second connection sub-assembly formed by the printed circuit 8 and the contact blades 10, as well as partially the contact body 16.

Figure 13:
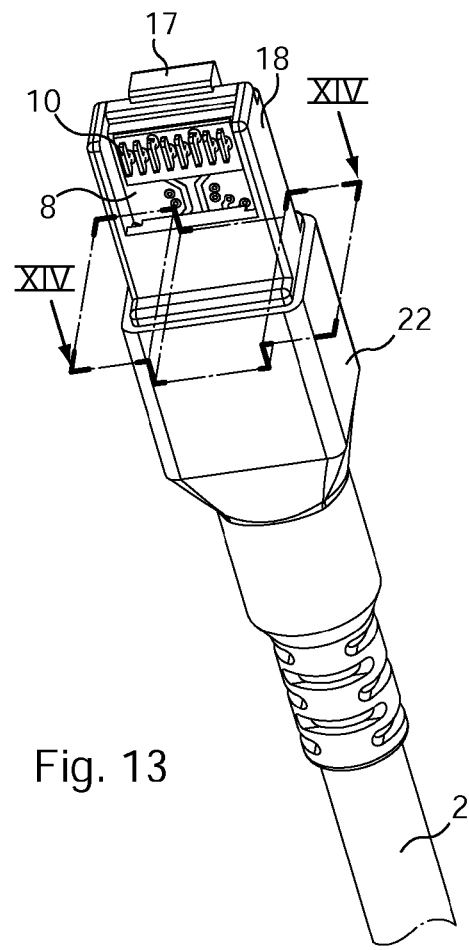

The third portion 244 is configured for the contact blades 10 to be accessible (FIG. 13).

The connector cover 19 is mounted on the connector body 18, the assembly lugs 348 and 362 of the connector cover 19 being received in the assembly notches 248 and 262 of the connector body 18; so as to establish an electrical contact between the connector cover 19 and the connector body 18. The upper projections 220, 221 and 222 of the spreader 9 which project from the upper ends of its central walls 212 and 28 are partially received in the respective cavities 346, 356 and 355 of the connector cover 19; so as to establish an electrical contact between the spreader 9 and the connector cover 19.

The grooves 351 of the second frusto-conical portion 343 cooperate with the bosses 217 of the separator body 25 of the spreader 9; so as to establish an electrical contact between the spreader 9 and the connector cover 19.

The contact and positioning members 357 of the third portion 344 come to bear on the respective bearing surfaces 227 of the positioning parts 223; so as to establish an electrical contact between the spreader 9 and the connector cover 19.

It will be noted that the snap-engaging part 17 is normally mounted on the circuit 8 before the assembly of the connector cover 19 on the connector body 18.

The snap-engaging part 17 is configured in order for the recessed portion 360 and the proud portion 361 comprised by the third portion 344 of the connector cover 19 to come to rest on that snap-engaging part 17.

The deformable lug of the snap-engaging part 17 is configured to remain outside the metallic envelope formed by the connector body 18 and the connector cover 19.

Thus, the first portion 342 of the connector cover 19 partially covers the first part of the central wall 212 and the respective first portions 214 of the lateral walls 213 of the separator body 25.

The second portion 343 of the connector cover 19 partially covers the second part of the central wall 212 and the respective second portions 215 of those lateral walls 213.

The third portion 344 of the connector cover 19 fully covers the spreader 9 and the second connection sub-assembly formed by the printed circuit 8 and the contact blades 10, as well as partially the snap-engaging part 17.

The sleeve 22 is next mounted on the cable 2 and comes to cover the major part of the metallic envelope, the deformable tab 29 of the sleeve 22 coming to bear on the deformable tab of the snap-engaging part 17.

The sleeve 22 envelopes the connector body 18 and the connector cover 19 starting from their respective first end 240, 340 as far as their respective shoulder 258, 358 formed in their respective third portion 244, 344; which generally corresponds to the location of the second end 211 of the spreader 9 in the metallic envelope.

Figure 14:
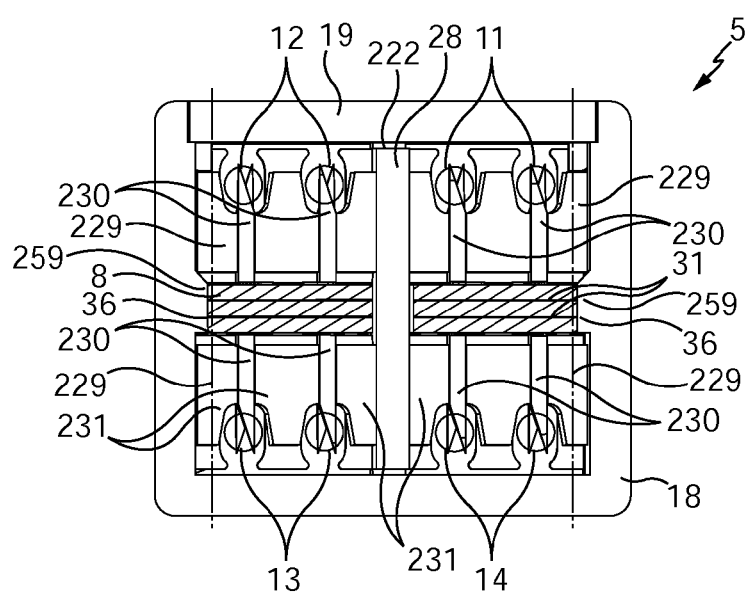
FIG. 14 is a cross-section view on XIV-XIV of FIG. 13.

FIG. 14 diagrammatically illustrates a cross section of the assembled male connector 5.

The grounding plates 31 of the circuit 8 are electrically connected to the connector body 18 via notches 36 and contact lugs 259.

The spreader 9 is electrically connected to the connector body and cover 18 and 19 via the cavities 246, 255, 256, 346, 355 and 356 and via the upper and lower projections, via the lateral bosses 217, 275 and 276 and the grooves 251, 351 and 277, and via the bearing surfaces 227 and the contact and positioning members 257 and 357.

The connector body and cover 18 and 19 are electrically connected together via their respective edges 249, 252, 263, 342 and 352 and also by the assembly lugs 348 and 362 and the assembly notches 248 and 262.

Thus, the connector body 18, the connector cover 19, the grounding plates 31 of the circuit 8 and the shielding central wall 28 are electrically connected together at the same time to a reference potential, and are configured to form individual electrically and/or magnetically shielding cages, also called "Faraday cages", formed around each pair of wires 11 to 14; while each conducting wire is electrically insulated from the others (including that of the same pair) by virtue of the respective molded body 231 of the respective self-stripping contact system 229 in which each conducting wire is received.

Figure 3:
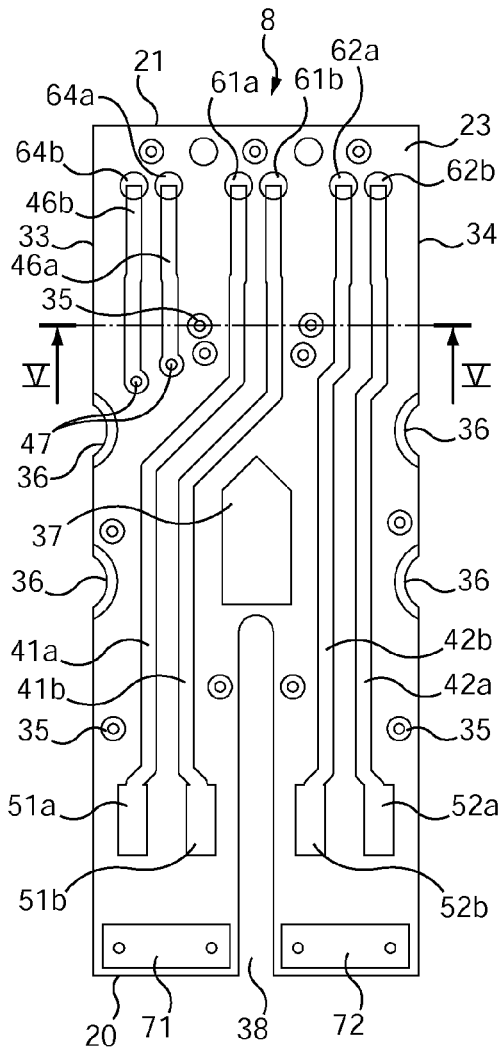
FIGS. 3 and 4 are diagrammatic representations of the two faces of a printed circuit comprised by each of the male connectors of the cord.
Figure 4:
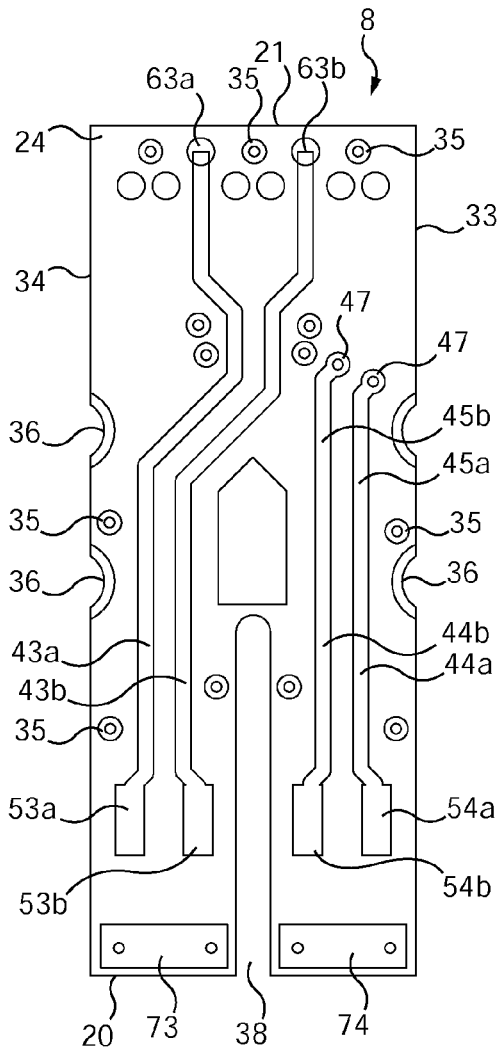
Figure 5:
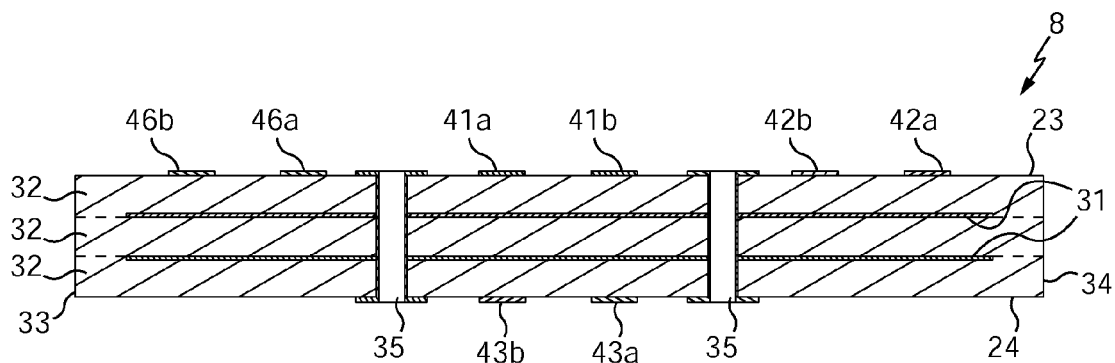
FIG. 5 is a cross-section view of the printed circuit on V-V of FIG. 3.

In variants that are not illustrated:
- the printed circuit does not have three substrate layers and four copper layers but for example two substrate layers and three copper layers, of which only one forms an grounding plane sandwiched between the two substrate layers;
- the printed circuit has conveyance tracks that are distinct from those illustrated in the drawings and for example has several or even all the conveyance tracks discontinuous or continuous on both faces of the circuit;
- the printed circuit has a greater number or fewer connection vias and/or they are formed with a different arrangement to that illustrated in FIGS. 3 and 4;
- the printed circuit has a longer or shorter slot provided that a major part of the central wall of the extension body of the spreader can be inserted therein;
- the grounding plate or plates are also electrically connected to the central wall of the extension body of the spreader via contacts points in the slot of the circuit, or even via the contact lug formed in the circuit at the end of the slot;
- the printed circuit has a greater number or fewer notches on its third and fourth sides; and/or
- the snap-engaging part is mounted on the printed circuit before insertion thereof into the connector body.

It should be noted more generally that the invention is not limited to the examples described and represented.

The invention claimed is:

1. A male RJ45 connector for an RJ45 electrical connection cord provided with a cable (2) having four pairs of conducting wires (11-14) that are configured to be electrically connected to said male connector (5, 6), which connector comprises a printed circuit (8) having a first face (23) and a second face (24) which is an opposite face to said first face (23), as well as a plurality of electrical conveyance tracks (41-46) to which said pairs of conducting wires (11-14) are configured to be connected electrically, a spreader system (9) mounted on said printed circuit (8) and configured to separate, electrically insulate and electrically shield said pairs of conducting wires (11-14) from each other; said male connector (5, 6) being characterized in that:

said printed circuit (8) comprises at least one grounding plate (31) sandwiched between its first and second faces (23, 24) and a central through-slot (38) extending longitudinally in said printed circuit (8) and opening on a side (20) of said printed circuit (8), said central through-slot (38) being configured to pass through both said first and second faces (23, 24) and said at least one electrical grounding plate (31);

said spreader system (9) comprises a separator body (25) and an extension body (26) projecting from said separator body (25), said extension body (26) being provided with a hollow (27) configured to receive said printed circuit (8) and an electrically and/or magnetically shielding central wall (28) dividing said hollow (27) into two parts and being configured to be inserted at least mostly into said central through-slot (38) of said printed circuit (8);

and said electrically and/or magnetically shielding central wall (28) and said at least one grounding plate (31) of said printed circuit (8) are configured to be electrically interconnected and thus form an electrically and/or magnetically shielding barrier between each pair of conducting wires (11-14).

2. A male RJ45 connector according to claim 1, characterized in that it further comprises a metallic envelope configured to envelope said printed circuit (8), at least partially, and said electrically and/or magnetically shielding central wall (28), said at least one grounding plate (31) and said metallic envelope are configured to be electrically interconnected and thus substantially form an individual electrically and/or magnetically shielding cage around each pair of conducting wires (11-14).

3. A male RJ45 connector according to claim 2, characterized in that said electrically and/or magnetically shielding central wall (28) is provided with an upper end and a lower end which is an opposite end to said upper end, and at least one projection (221, 222) provided projecting from at least one said upper and/or lower end and configured to be at least partially received in at least one cavity (255, 256, 355, 356) formed in said metallic envelope.

4. A male RJ45 connector according to claim 2, characterized in that said male connector further comprises contact blades (10) configured to be fastened to said printed circuit (8) and a contact body (16) configured to be mounted on said contact plates (10), and said metallic envelope is provided with a recessed portion (360) and/or a proud portion (361) against which is positioned said contact body (16).

5. A male RJ45 connector according to claim 2, characterized in that it further comprises a snap-engaging part (17) configured to immobilize said male connector (5, 6) in a female connector in which said male connector (5, 6) is configured to be mounted, and said metallic envelope is provided with a recessed portion (260) and/or a proud portion (261) against which is positioned said snap-engaging part (17).

6. A male RJ45 connector according to claim 2, characterized in that said metallic envelope is formed in two parts, respectively a connector body (18) configured to receive said printed circuit (8) and said spreader system (9), as well as a connector cover (19) configured to be mounted on said connector body (18) and to cover said printed circuit (8) and said spreader system (9).

7. A male RJ45 connector according to claim 2, characterized in that said printed circuit (8) is provided with at least one notch (36) formed on at least one side (33, 34) of said printed circuit (8) and said metallic envelope is provided with at least one contact lug (259) configured to cooperate with said at least one notch (36) so as to establish an electrical connection between said at least one grounding plate (31) and said metallic envelope.

8. A male RJ45 connector according to claim 2, characterized in that said spreader system (9) further comprises self-stripping contact systems (229) configured to establish an electrical connection between said pairs of conducting wires (11-14) and said electrical conveyance tracks (41-46) of said printed circuit (8), each self-stripping contact system (229) being provided with two self-stripping contact members (230) and with a molded body (231) that is configured to receive at least partially and to electrically insulate from each other said self-stripping contact members (230), said extension body (26) of said spreader system (9) comprises two positioning parts (223) mounted on said central wall (28) on respective opposite sides of said hollow (27), and each molded body (231) is fastened both to a respective said positioning part (223) and to said separator body (25).

9. A male RJ45 connector according to claim 8, characterized in that at least one said positioning part (223) has an outside face (228) on which is formed at least one bearing surface (227) and said metallic envelope is provided with at least one contact and positioning member (257, 357) which is configured to come to bear on said at least one bearing surface (227); and/or at least one said positioning part (223) has lateral bosses (276) and said metallic envelope has at least one inside face (250) provided with grooves (277) which are configured to cooperate with said lateral bosses (276).

10. A male RJ45 connector according to claim 8, characterized in that each molded body is (231) provided with a base face (237) turned towards said hollow (27), with three longitudinal small walls (235) situated apart from each other and extending remotely from said base face (237), two insertion spaces (236) each provided between two successive small walls (235) and each extending transversely in said molded body (231) until they open onto said base face (237), and each self-stripping contact member (230) is inserted into a respective said insertion space (236) and projects on respective opposite sides of said space.

11. A male RJ45 connector according to claim 8, characterized in that each molded body (231) is provided with a base face (237) and with at least one rib (238) formed on said base face (237) and projecting into said hollow (27) formed in said extension body (26), said at least one rib (238) being configured to guide said printed circuit (8) into said hollow (27).

12. A male RJ45 connector according to claim 8, characterized in that said separator body (25) is provided with first attachment lugs (218) extending towards a respective said positioning part (223) which is provided with at least one second attachment lug (226) extending facing a respective said first attachment lug (218), and each molded body (231) is provided with two pincer-shaped ends respectively mounted on a said first attachment lug (218) and on a second said attachment lug (226) facing the latter.

13. A male RJ45 connector according to claim 2, characterized in that said separator body (25) comprises a cross-shaped metallic base having a central wall (212) and two lateral walls (213) disposed on respective opposite sides of the central wall (212), said central wall (212) having an upper end and a lower end which is an opposite end to said upper end, and at least one projection (220) formed projecting from at least one said upper and/or lower end and configured to be at least partially received in at least one cavity (246, 255, 346, 355) formed in said metallic envelope.

14. A male RJ45 connector according to claim 2, characterized in that said separator body (25) comprises a cross-shaped metallic base having a central wall (212) and two lateral walls (213) disposed on respective opposite sides of the central wall (212) and each having a portion (215) provided with lateral bosses (217, 275), and said metal envelope has at least one inside face (250, 350) provided with grooves (251, 277, 351) which are configured to cooperate with said lateral bosses (217, 275).

15. An RJ45 connection cord configured to interconnect items of electronic and/or computer equipment, comprising an electric cable (2) having a first end (3) and a second end (4) which is an opposite end to the first end (3), an insulating sheath (15) and four pairs of conducting wires (11-14) enveloped in said sheath (15); and at least one male RJ45 connector (5, 6) according to claim 1, mounted on at least one said first end (3) and/or second end (4) of said cable (2).

16. A male RJ45 connector according to claim 3, characterized in that said male connector further comprises contact blades (10) configured to be fastened to said printed circuit (8) and a contact body (16) configured to be mounted on said contact plates (10), and said metallic envelope is provided with a recessed portion (360) and/or a proud portion (361) against which is positioned said contact body (16).

17. A male RJ45 connector according to claim 3, characterized in that it further comprises a snap-engaging part (17) configured to immobilize said male connector (5, 6) in a female connector in which said male connector (5, 6) is configured to be mounted, and said metallic envelope is provided with a recessed portion (260) and/or a proud portion (261) against which is positioned said snap-engaging part (17).

18. A male RJ45 connector according to claim 9 characterized in that each molded body is (231) provided with a base face (237) turned towards said hollow (27), with three longitudinal small walls (235) situated apart from each other and extending remotely from said base face (237), two insertion spaces (236) each provided between two successive small walls (235) and each extending transversely in said molded body (231) until they open onto said base face (237), and each self-stripping contact member (230) is inserted into a respective said insertion space (236) and projects on respective opposite sides of said space.

19. A male RJ45 connector according to claim 9, characterized in that each molded body (231) is provided with a base face (237) and with at least one rib (238) formed on said base face (237) and projecting into said hollow (27) formed in said extension body (26), said at least one rib (238) being configured to guide said printed circuit (8) into said hollow (27).

20. A male RJ45 connector according to claim 9, characterized in that said separator body (25) is provided with first attachment lugs (218) extending towards a respective said positioning part (223) which is provided with at least one second attachment lug (226) extending facing a respective said first attachment lug (218), and each molded body (231) is provided with two pincer-shaped ends respectively mounted on a said first attachment lug (218) and on a second said attachment lug (226) facing the latter.

* * * * *